United States Patent
Shrier

(10) Patent No.: US 7,218,492 B2
(45) Date of Patent: May 15, 2007

(54) DEVICES AND SYSTEMS FOR ELECTROSTATIC DISCHARGE SUPPRESSION

(75) Inventor: Karen Pamelia Shrier, Jarrell, TX (US)

(73) Assignee: Electronic Polymers, Inc., Round Rock, TX (US)

( * ) Notice: Subject to any disclaimer, the term of this patent is extended or adjusted under 35 U.S.C. 154(b) by 127 days.

(21) Appl. No.: 10/944,124

(22) Filed: Sep. 17, 2004

(65) Prior Publication Data

US 2006/0061925 A1  Mar. 23, 2006

(51) Int. Cl.
*H02H 9/00* (2006.01)

(52) U.S. Cl. .................. 361/56; 361/91.1; 361/111; 361/118; 338/20; 338/21

(58) Field of Classification Search .............. 361/56, 361/117, 792–795, 91.1, 111, 118; 338/20, 338/21
See application file for complete search history.

(56) References Cited

U.S. PATENT DOCUMENTS

| | | | |
|---|---|---|---|
| 4,726,991 A | 2/1988 | Hyatt et al. | 428/329 |
| 4,977,357 A | 12/1990 | Shrier | 338/21 |
| 5,068,634 A | 11/1991 | Shrier | 338/21 |
| 5,099,380 A | 3/1992 | Childers et al. | 361/56 |
| 5,248,517 A | 9/1993 | Shrier et al. | 427/58 |
| 5,807,509 A | 9/1998 | Shrier et al. | 252/512 |
| 6,108,184 A * | 8/2000 | Minervini et al. | 361/111 |
| 6,172,590 B1 | 1/2001 | Shrier et al. | 338/20 |
| 6,239,687 B1 | 5/2001 | Shrier et al. | 338/21 |
| 6,310,752 B1 | 10/2001 | Shrier | 361/56 |
| 6,542,065 B2 | 4/2003 | Shrier | 338/21 |
| 6,657,532 B1 | 12/2003 | Shrier | 338/21 |
| 2004/0160300 A1 | 8/2004 | Shrier | 337/16 |

* cited by examiner

*Primary Examiner*—Stephen W. Jackson
*Assistant Examiner*—Terrence Willoughby
(74) *Attorney, Agent, or Firm*—Fish & Richardson P.C.

(57) ABSTRACT

A device (10) for suppressing electrostatic discharge comprises first and second multilayer structures (14, 16) surrounding an electrostatic discharge reactance layer (12), the resistance of said electrostatic discharge reactance layer (12) varying in response to the occurrence of an electrostatic discharge signal. Each multilayer structure (14, 16) comprises a barrier layer (18), a terminal layer (20) and an electrode layer (28). Alternatively, a conductive layer (80) can be used instead of a second multilayer structure (16). An ESD suppression device (110) can be embedded in a printed circuit board (122, 210) providing a way to protect board components from harmful ESD events.

18 Claims, 6 Drawing Sheets

DEVICES AND SYSTEMS FOR ELECTROSTATIC DISCHARGE SUPPRESSION

CROSS-REFERENCE TO RELATED APPLICATIONS

This application is related to application Ser. No. 10/366,174 entitled "ESD Protection Devices and Methods of Making Same Using Standard Manufacturing Processes" filed Feb. 2, 2003, naming common inventor Karen P. Shrier, the entirety of which is incorporated herein by reference.

TECHNICAL FIELD

The present invention relates to electronic circuit protection devices and systems including same. More particularly, the invention relates to devices for suppressing electrostatic discharge. Still more particularly, the invention related to a device for ESD suppression comprising first and second multilayer structures surrounding a electrostatic discharge reactance layer, the resistance of which varies in response to the occurrence of an electrostatic discharge signal.

BACKGROUND OF THE INVENTION

The problems of static electricity and Electrostatic Discharge (ESD) are well known in the electronics industry. In general, electronic components are damaged following the occurrence of electrical events that cause the transfer of charge from one material to another creating a voltage surge related to voltage potential differences between the two materials. The Electrostatic Discharge Association (ESDA) cites industry experts as estimating that product losses due to ESD range from 8–33%. According to the ESDA, others have estimated the actual cost of ESD damage to the electronics industry as running into the billions of dollars annually.

In general, basic methods of protecting components from ESD damage include some basic precautions such as proper grounding or shunting that will "dissipate" or discharge transient signals away from the device to be protected. Still other methods include the use of packages and handling techniques that will protect susceptible devices during transport and shipping. While such techniques have been effectively used to shield the product from charge and to reduce the generation of charge caused by any movement of product within the container housing the device to be protected, they have not completely eliminated the risk of damage. Moreover, it is well known that more modern devices operating in the higher frequencies (GHz and above) using submicron line widths are more susceptible to damage which can not be overcome using such methods.

Components designed to react to ESD events and provide a discharge path to ground are known in the arts. Examples of such components include diodes and capacitors. In addition, other components are based on the teachings of references such as U.S. Pat. No. 6,172,590 entitled "Over-voltage protection device and method for making same" to Shrier et. al which describes a discrete electrical protection device that utilizes a gap between two electrically conductive members attached to an electrically insulating substrate. According to the '590 patent, the electrical protection device can be either surface mounted or built with through-holes for accommodating leads on an electrical connector. The '590 describes and claims methods for making an electrical protection device that includes an electrically insulating substrate.

U.S. Pat. No. 6,310,752 entitled "Variable voltage protection structures and method for making same" to Shrier et. al. describes and claims a variable voltage protection component that includes a reinforcing layer of insulating material having a substantially constant thickness embedded in a voltage variable material. According to the '752 patent, the reinforcing layer defines a uniform thickness for the variable voltage protection component resistive to compressive forces that may cause a reduction in the clamp voltage or a short in the voltage variable material. The '752 patent also describes methods for making such a variable voltage protection component.

Prior art ESD suppression devices, such as those incorporating the teachings of the '590 patent and the '752 patent, have been successfully made and used. Generally, such devices utilize a couple of electrodes with some type of surge material interspersed between the electrodes. One electrode provides the transient signal input terminal while the other provides the discharge path to ground. A barrier layer known as the substrate or reinforcement layer is used to provide the necessary stiffness permitting the component to be surface mounted or through-holed.

Such prior art protection components, however, suffer from several limitations attributed to the requirement that a substrate or reinforcing layer be used. Specifically, the use of a substrate adds significantly to the component's overall size and cost. In addition, the relatively large size and profile of such prior art protection components makes their use impractical in tight spaces where board space is limited. Moreover, since the substrate material is a primary expense in the manufacture of such components, the use of prior art protection components on a widespread basis can be cost prohibitive. In addition, the use of prior art ESD protection devices in printed circuit board applications may require an individual device be surface mounted to each component or signal path to be protected which may be cost prohibitive.

As electronic devices became faster and smaller, their sensitivity to ESD increases. ESD impacts productivity and product reliability in virtually every aspect of today's electronics environment. Many aspects of electrostatic control in the electronics industry also apply in other industries such as clean room applications and signal line proliferation.

Therefore, a need exists for a cost effective low profile protection component that can be more widely used across a wider range of applications including in printed circuit board applications.

BRIEF DESCRIPTION OF THE DRAWINGS

Specific embodiments of the invention will be understood from consideration of the following detailed description as well as the appended drawings in which.

References in the detailed description refer to like references in the figures unless otherwise indicated.

DETAILED DESCRIPTION OF THE PREFERRED EMBODIMENTS

Figure 1A:
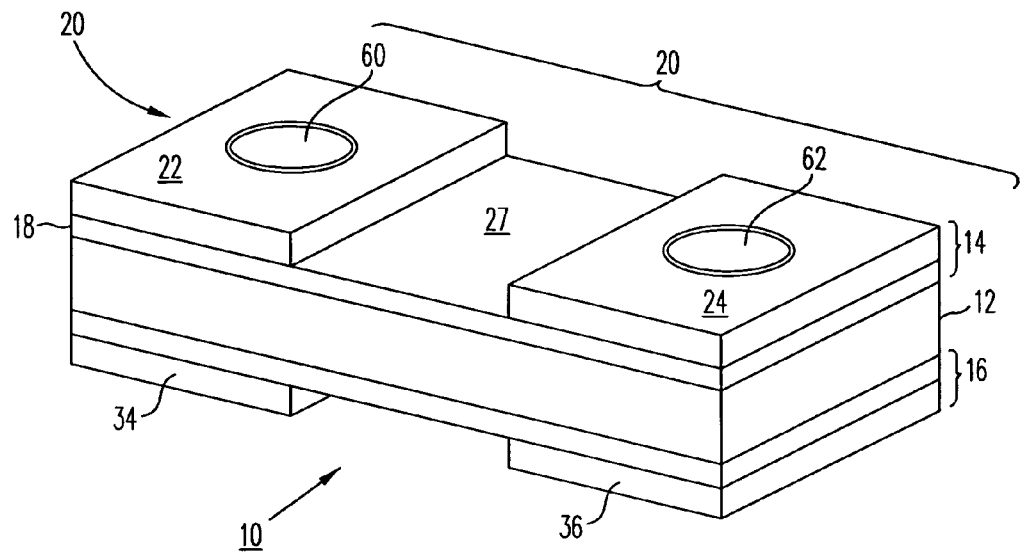
FIGS. 1a and 1b are perspective and cross-sectional views of a device for suppressing electrostatic discharge according to a first embodiment.
Figure 1B:
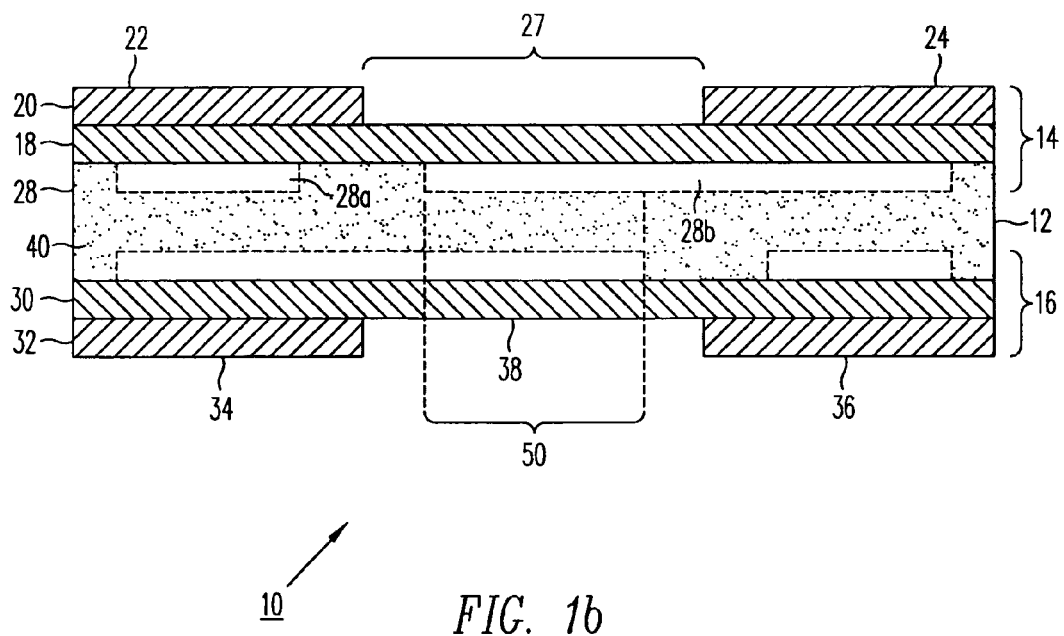

Referring to FIGS. 1a and 1b, a device 10 for suppressing electrostatic discharge according to one embodiment of the invention is shown consisting of electrostatic discharge reactance layer 12 between first and second multilayer structures 14 and 16. Preferably, the electrostatic discharge reactance layer 12 comprises a polymer-based suppression material such as is described in related application Ser. No. 10/366,174 entitled "ESD Protection Devices and Methods of Making Same Using Standard Manufacturing Processes" (the "Related Application") or a similar material as may be readily obtained in industry from, for example, Electronic Polymers, Inc. and/or other industry sources. The device 10 may be made using standard printed circuit board manufacturing techniques as are well known in the industry and/or as described in the Related Application. Since the performance characteristics of a polymer-based voltage variable material may vary, it is contemplated that device 10 can be utilized in a wide array of applications by altering material characteristics for different trigger voltages, clamping voltages and maximum voltage suppression levels.

Both first and second multilayer structures 14 and 16 of device 10 include a top and bottom conductive layers (described below) and a barrier layer 18 and 30, respectively, which allow device 10 to have an extremely low profile when compared with prior art ESD protection devices. Thus, the use of low profile multilayer structures, such as first and second multilayer structures 14, 16, reduce the overall size and bulk of device 10 making it especially suitable for surface mount and embedded board applications. Barrier layers 18, 30 provide an electrical insulating material that is sandwiched between two conductive layers. It has been found that a polyimide film such as Kapton® (from Dupont provides suitable insulating characteristics while maintaining the desired low profile since it forms an impenetrable barrier with the thickness of a film (Kapton® is a registered trademark of the Dupont company). Thus, the use of a polyimide film within a multilayer structure, such as multilayer structures 14 and 16, solves many of the problems associated with prior art ESD protection devices that require a substrate or reinforcing layer and which add significantly to the overall size and profile of the suppression device.

First multilayer structure 14 also includes a conductive terminal layer 20 which provides an ESD signal interface to the device 10. Under normal conditions, i.e. without the occurrence of an ESD event, electrical signals bypass the electrostatic discharge reactance layer 12 via terminals 22 and 24 of terminal layer 20, one of which is in electrical continuity with a device or signal pathway to be protected (not shown in FIGS. 1a and 1b). Thus, when not stressed by an ESD signal, terminals 22 and 24 function as input and output terminals for data and/or power signals native to the device to be protected. Also, while terminals 22 and 24 are shown a square in shape, it should be understood that terminals 22 and 24 can assume any shape or configuration depending on the application.

Figure 3:
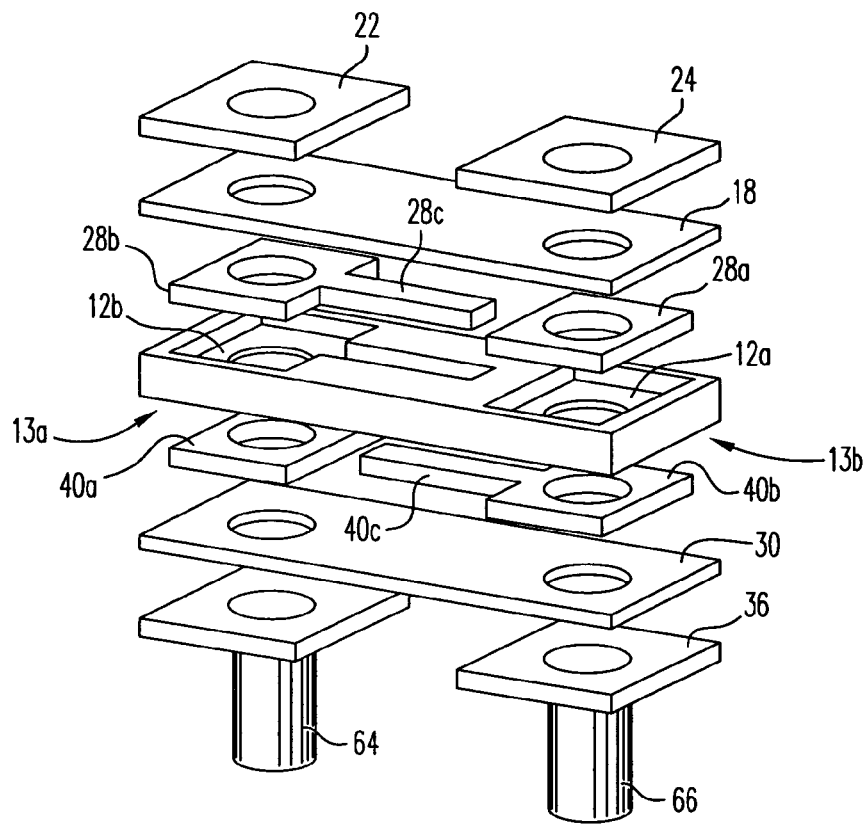
FIG. 3 shows the layer configuration detail in perspective view for the device for suppressing electrostatic discharge of FIGS. 1a and 1b.

As shown, terminals 22 and 24 are separated by gap 27 and coupled to one side (or surface) of the barrier layer 18. The Related Application discloses methods for forming terminals, such as terminals 22 and 24, on a layer, such as barrier layer 18, using well known PCB manufacturing methods. Opposite terminal layer 20 is a conductive electrode layer 28 consisting of electrodes 28a and 28b which, as shown in FIG. 1b, are embedded in electrostatic discharge reactance layer 12. FIG. 3 shows the configuration of electrodes 28a and 28b which fit in cavities 12a and 12b of electrostatic discharge reactance layer 12. Electrode 28b is shown having an extension 28c which extends into electrostatic discharge reactance layer 12. It has been found that the physical dimensions of the electrodes 28a and 28b can be altered to, in turn, effect the performance of the device 10. Thus, extension 28c helps effect the performance of the device 10 by influencing, for example, the trigger voltage level, the clamping voltage level and maximum voltage suppression level of the device 10. Other performance variable may also be influenced by the physical dimensions of electrodes 28a, 28b. For this reason, extension 28c can be altered by, for example, making it longer, shorter, wider or thicker to effect the performance of the device 10.

Second multilayer structure 16 is similar to first multilayer structure 14 as shown in FIG. 1b. Specifically, second multilayer structure 16 has a conductive terminal layer 32 having terminals 34 and 36 with gap 38 in between. Terminals 34, 36 can be utilized as connection points to a ground reference allowing the safe discharge of harmful ESD signals and away from a device or signal path to be protected. Thus, in the event of an ESD event, the ESD signal would enter electrostatic discharge reactance layer 12 through either terminal 22 or terminal 24, and exit through either terminal 34 or terminal 36. In this way, a device, component or feature that would otherwise be destroyed by an ESD event can be protected.

With reference to FIG. 1b and FIG. 3, electrode layer 40 is seen to comprise electrodes 40a and 40b. In one embodiment, electrodes 40a and 40b are contained within cavities (not shown but pointed to by arrows 13a and 13b) opposite cavities 12a and 12b which are formed within electrostatic discharge reactance layer 12. As with electrode 28b, electrode 40b also has an extension 40c whose physical characteristics may be altered to effect the performance characteristics of the device 10. FIG. 1b shows overlap 50 between extension 28c and extension 40c. It has been found that the extent of overlap 50 between extensions 28c and 40c can also be considered as a factor in the overall performance of the device 10. For example, the overlap 50 can influence the device's trigger voltage, clamping voltage and maximum protection voltage. Thus, device 10 provides a configuration for an ESD suppression component that can be adjusted to suit many applications.

FIGS. 1a, 1b, 3 and 4, show that device 10 can be equipped with plated through-holes 60, 62 which supported surface mount applications and provide signal continuity from the various layers of the device. Conductors 64 and 66 (FIG. 3) comprise a plating material that provides the electrical signal pathway between layers of the device 10. It should be understood, however, the other ways of providing layer-to-layer continuity may be utilized such as, for example, by using vias and electrical traces. The use of plated through-holes 60, 62 eliminates the need to incorporate a substrate or reinforcing layer of material as the device may be firmly held in place by fasteners, solder joints, ribbits, or other structures (not shown) inserted in through-holes 60, 62. Thus, plated through-holes 60, 62 in combination with multilayer structures 14, 16 also allow device to maintain a small size and small profile compared to the known prior art.

Figure 2A:
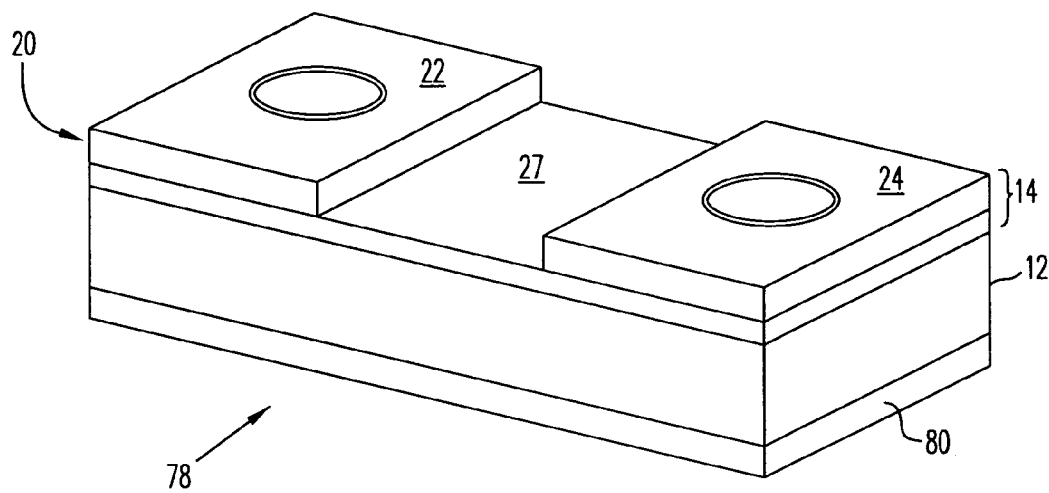
FIGS. 2a and 2b are perspective and cross-sectional views, respectively, of a device for suppressing electrostatic discharge according to a second embodiment.
Figure 2B:
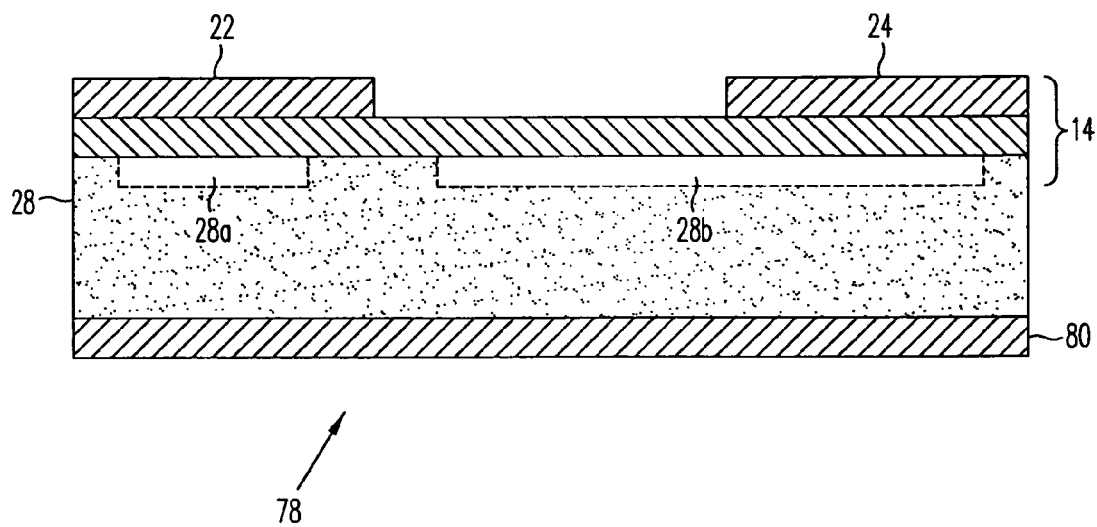
Figure 4:
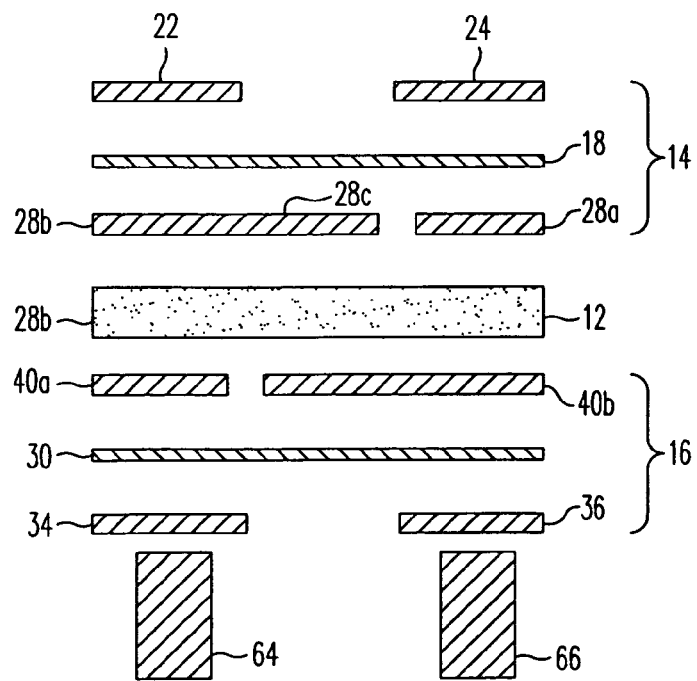
FIG. 4 is a cross-sectional view of the layer configuration of FIG. 3.

FIG. 4 is a cross section of device 10 as a layered assembly with all layers shown separated. As such, device 10 provides and ESD suppression device with two (2) multilayer structures 14, 16 surrounding one electrostatic discharge reactance layer 12. FIGS. 2a and 2b illustrate a device, denoted generally as 78, for suppressing electrostatic discharge having a single multilayer structure 14 attached to one surface of an electrostatic discharge reactance layer 12 with a conductive layer 80 attached to a second surface of the electrostatic discharge reactance layer 12 opposite the multilayer structure 14. Device 78 provides an alternative to device 10 and is, in general, more cost effective to manufacture since only a single multilayer structure 14 is utilized. Conductive layer 80 can be any suitable conductor such as Copper and can be attached directly to a ground reference point within the application in which device 78 is utilized. Thus, an ESD signal would traverse a signal path from terminal layer 20 (via terminals 22 and/or 24) through electrostatic discharge reactance layer 12 and to conductive layer 80 which leads to ground safely discharging harmful ESD signals.

Figure 5:
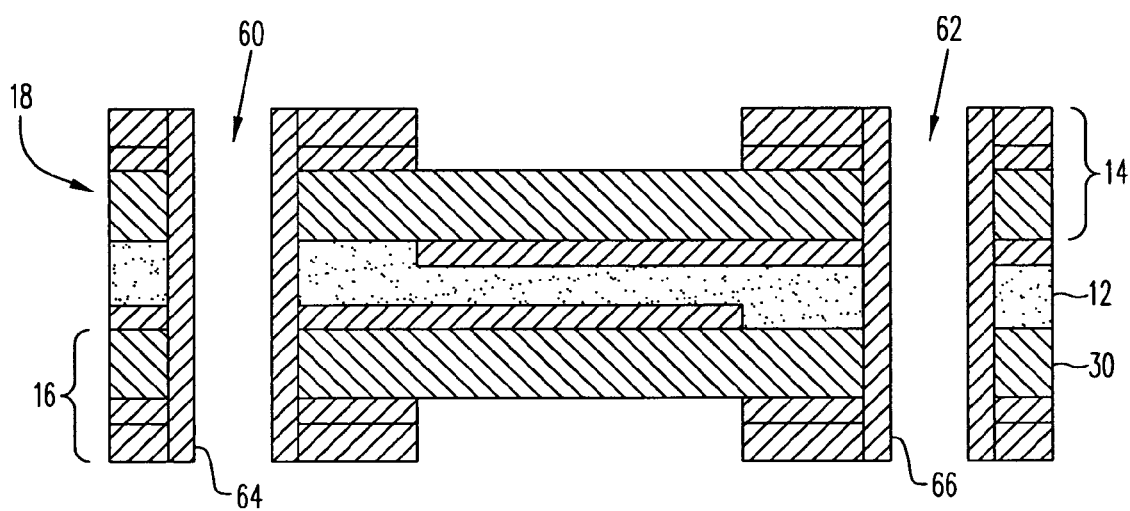
FIG. 5 is a cross-sectional view of the device configuration of FIGS. 1a and 1b with dual plated through-holes.
Figure 6:
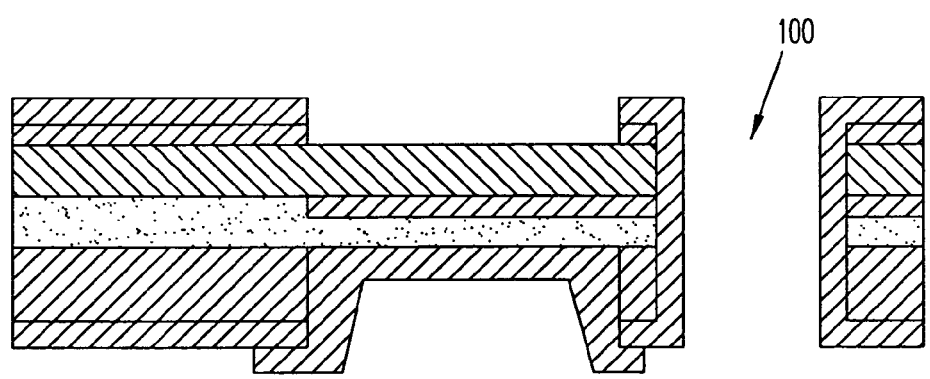
FIG. 6 is a cross-sectional view of the device configuration of FIGS. 2a and 2b with a single plated through-hole.

FIG. 5 is a cross-sectional view of device 10 shown as a layered assembly having through-holes 60, 62 with plating conductors 64, 66, respectively, inserted therein. FIG. 6 shows a variation of device 78 with a single through-hole 100. Each variation of the ESD device according to the invention provides an alternate assembly to accommodate different manufacturing environment and applications. As such, various modifications of each device 10 or 78 are contemplated all within the scope of the invention.

Figure 7:
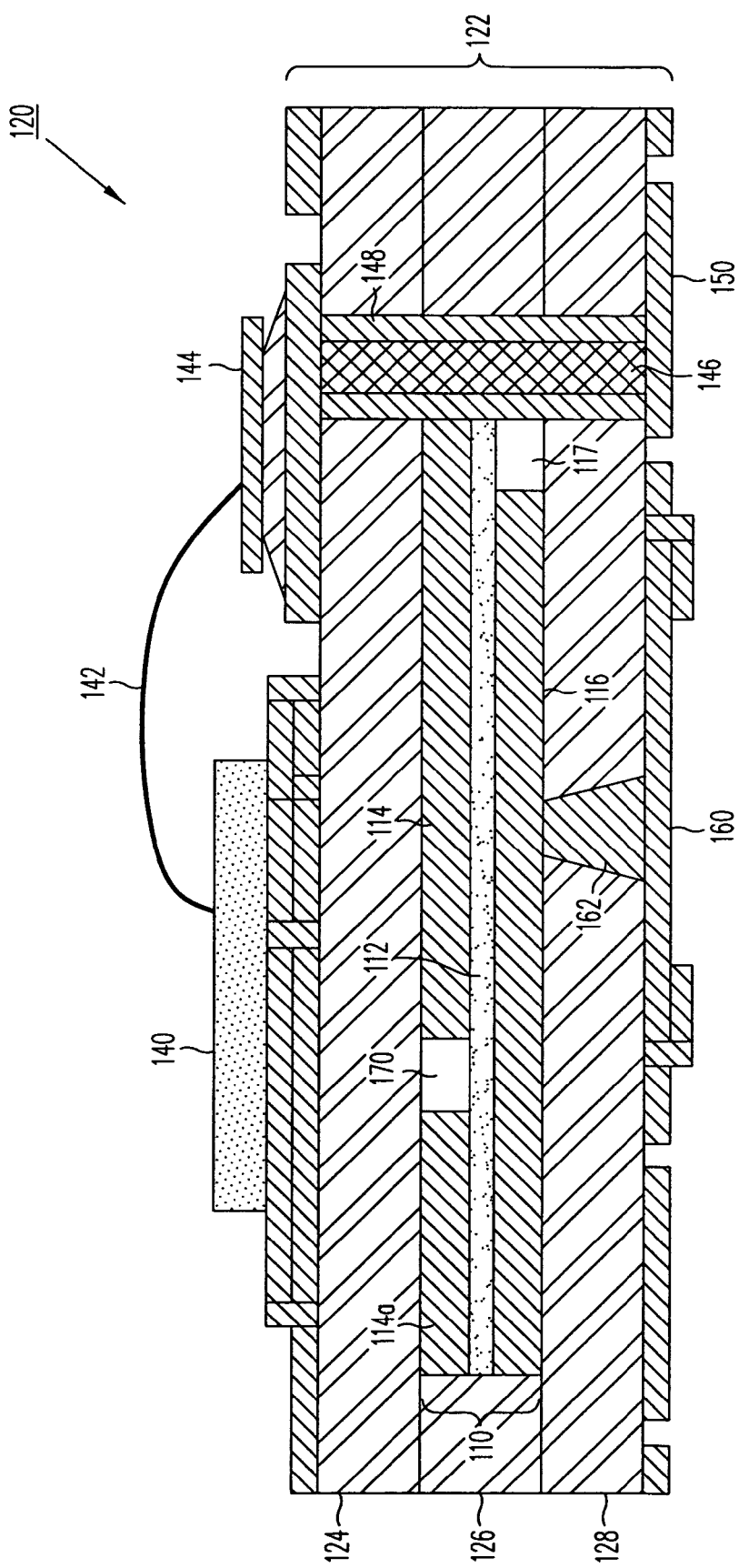
FIGS. 7 and 8 illustrate the use of a device for suppressing electrostatic discharge according to the invention within first and second printed circuit board systems.

FIG. 7 shows the use of a device 110 for suppressing electrostatic discharge within a printed circuit board system 120. Specifically, printed circuit board 122 comprises layers 124, 126 and 128. A portion of layer 126 has been embedded with device 110 which conforms to the general configuration of an ESD suppression device according to the invention, such as device 10 or device 78. A component to be protected 140 may comprise an integrated circuit (IC) such as a processor, power amplifier, memory circuit or any other of a host of other components which are sensitive to ESD and which may be damaged should it be subjected to an ESD signal. Component 140 is attached to pad 144 with wire bond 142 providing continuity between component 140 and signal trace 150. In this way, a signal pathway is established between from component 140 to signal trace 150 via wire bond 142, pad 144 and plated through-hole 146.

In the event an ESD signal threatens component 140, electrostatic discharge reactance layer 112 reacts by creating a signal path between multilayer structure 114 and structure/layer 116 which, as shown, is connected to ground plane 160 via trace 162. Being a polymer-based ESD suppression material, the principles of operation of electrostatic discharge reactance layer 112 are such that electrostatic discharge reactance layer 112 presents resistance to signal flow through electrostatic discharge reactance layer 112 with signal continuity maintained between component 140 and trace 150, thus bypassing device 110 during normal operation. Isolation 117 provides a way of isolating device 110 from signal pathways during normal operation. Of course, any other suitable means of isolating device 110 from structures within the board 122 may be utilized.

Device 110 may be embedded within the layers of a typical printed circuit board providing ESD protection for a variety of components, such as component 140. A gap 170 allows the configuration of structure 114 as dictated by a particular design. Thus, structure segment 114a can be used to couple signal pathways from other areas or other pins of a component, such as a component 140, to device 110. In this way, multiple components, signal pathways or pins of a single component may be protected.

Figure 8:
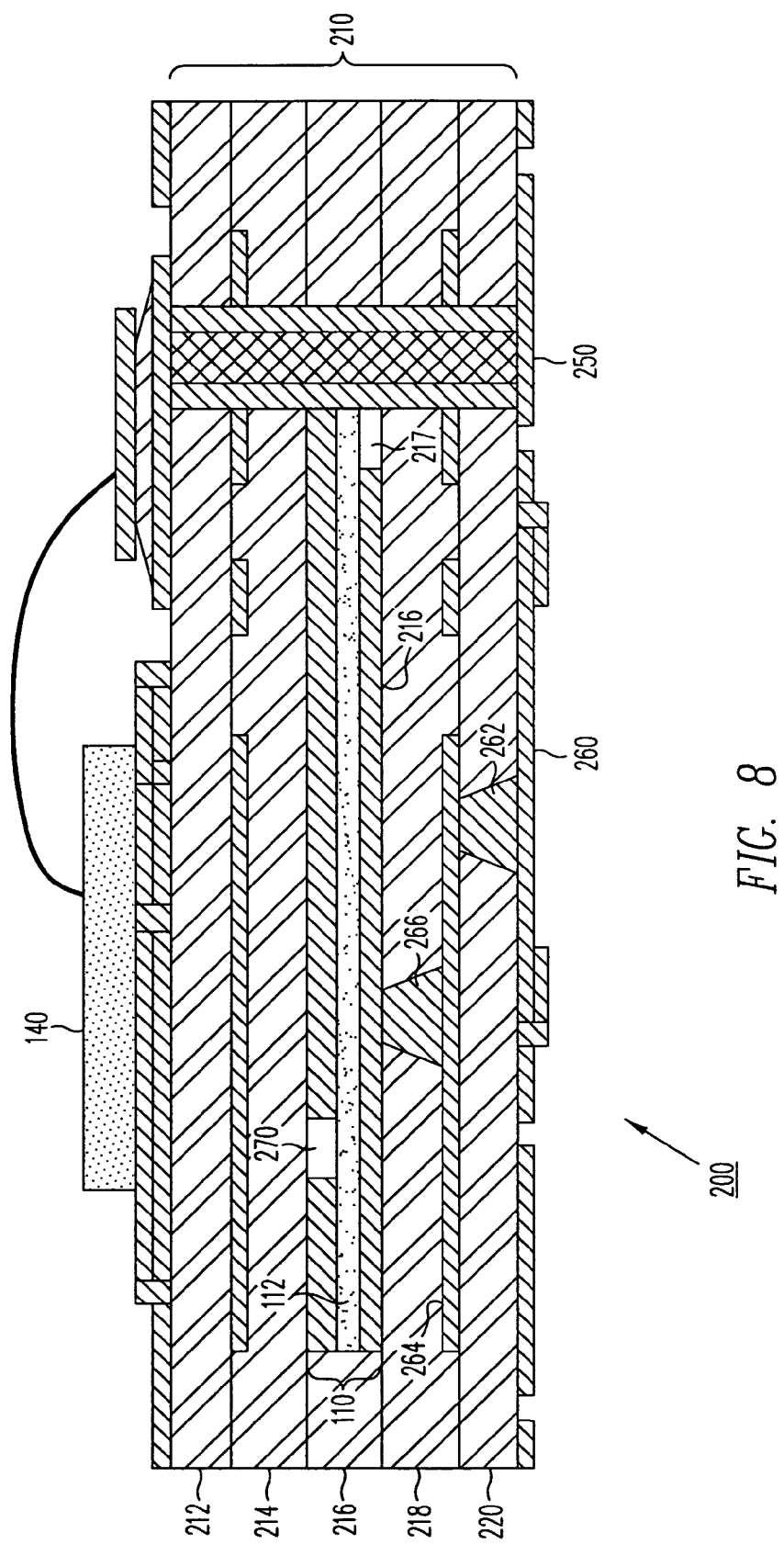

FIG. 8 shows the use of device 110 in a printed circuit board system 200 having more layers than system 120. As shown, printed circuit board 210 has five layers 212, 214, 216, 218 and 220. Embedded within layer 216 is device 110 which function substantially as described above with respect to board 122. A connection between structure/layer 216 and ground 260 of the application 200 is provided via trace 266, trace 264, and trace 262. Isolation 217 ensures device 110 is disconnected from signal pathways to be protected during normal operation. Otherwise, during the occurrence of an ESD event, the ESD signal traverses through electrostatic discharge reactance layer 112 and safely to ground 260 ensuring that a component to be protected, such as component 114, is not damaged.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. It is therefore intended that the appended claims encompass any such modifications or embodiments.

What is claimed is:

1. A device for suppressing electrostatic discharge comprising first and second multilayer structures surrounding an electrostatic discharge reactance layer, the resistance of said electrostatic discharge reactance layer varying in response to the occurrence of an electrostatic discharge signal wherein said first multilayer structure comprises:
   a first barrier layer having top and bottom surfaces;
   a first terminal layer coupled to said top surface of said first barrier layer; and
   a first electrode layer coupled to said bottom surface of said first barrier layer and making contact with said electrostatic discharge reactance layer, and
wherein said second multilayer structure comprises;
   a second barrier layer having top and bottom surfaces;
   a second terminal layer coupled to the bottom of said second barrier layer;
   a second electrode layer coupled to the top of said second barrier layer and making contact with said electrostatic discharge reactance layer opposite said first electrode layer.

2. The device of claim 1 wherein said electrostatic discharge reactance layer suppresses said electrostatic discharge signal by causing current flowing through said first multilayer structure to flow from said first multilayer structure to said second multilayer structure.

3. The device of claim 1 wherein said electrostatic discharge reactance layer further causes cavities for holding said first and second electrode layers.

4. The device of claim 1 wherein said first and second barrier layers are made of a polymeric film material.

5. The device of claim 1 wherein said first terminal layer further comprises an input terminal and a first output terminal separated by an air gap.

6. The device of claim 5 wherein said second terminal layer further comprises a second output terminal.

7. The device of claim 1 wherein said first electrode layer comprises at least one electrode in electrical contact with said first terminal layer through said first barrier layer, said electrode forming a first extension into said electrostatic discharge reactance layer.

8. The device of claim 7 wherein said second electrode layer comprises first and second electrodes in electrical contact with said second terminal layer through said second barrier layer, said first electrode of said second electrode layer forming a second extension into said electrostatic discharge reactance layer opposite said first extension.

9. The device of claim 8 wherein the amount of vertical overlap between said first and second extension effects the performance characteristics of said electrostatic discharge reactance layer.

10. The device of claim 1 further comprising first and second through-holes extending through said first and second multilayer structures and said electrostatic discharge reactance layer.

11. The device of claim 10 wherein said first and second through-holes are plated.

12. The device of claim 1, wherein the second terminal layer is attached to a ground.

13. The device of claim 1, wherein the first electrode layer comprises an extension in the electrostatic discharge reactance layer.

14. The device of claim 13, wherein a length of the extension affects the performance characteristics of the device.

15. A system with integrated electrostatic discharge suppression comprising:
 a printed circuit board; and
 a device for suppressing electrostatic discharge coupled to the printed circuit board comprising first and second multilayer structures surrounding an electrostatic discharge reactance layer, the resistance of said electrostatic discharge reactance layer varying in response to the occurrence of an electrostatic discharge signal,
 wherein said first multilayer structure comprises:
  a first barrier layer having top and bottom surfaces;
  a first terminal layer coupled to said top surface of said first barrier layer; and
  a first electrode layer coupled to said bottom surface of said first barrier layer and making contact with said electrostatic discharge reactance layer, and
 wherein said second multilayer structure comprises:
  a second barrier layer having top and bottom surfaces;
  a second terminal layer coupled to the bottom of said second barrier layer;
  a second electrode layer coupled to the top of said second barrier layer and making contact with said electrostatic discharge reactance layer opposite said first electrode layer.

16. The system of claim 15, wherein said printed circuit has a ground and wherein said second multilayer structure makes signal contact with said ground.

17. The system of claim 15, wherein the device is surface mounted to the printed circuit board.

18. The system of claim 15 wherein the device is embedded within the printed circuit board.

* * * * *